United States Patent
Liao

[11] Patent Number: 6,010,943
[45] Date of Patent: Jan. 4, 2000

[54] METHOD OF FABRICATING A CYLINDRICAL CAPACITOR

[75] Inventor: Kuan-Yang Liao, Taipei, Taiwan

[73] Assignee: United Silicon Incorporated, Taipei, Taiwan

[21] Appl. No.: 09/089,248

[22] Filed: Jun. 2, 1998

[30] Foreign Application Priority Data

Apr. 23, 1998 [TW] Taiwan ................................. 87106242

[51] Int. Cl.⁷ .................................................. H01L 21/20
[52] U.S. Cl. .......................................... 438/397; 257/303
[58] Field of Search ................... 438/396, 399; 430/313

[56] References Cited

U.S. PATENT DOCUMENTS

| | | | |
|---|---|---|---|
| 5,041,362 | 8/1991 | Douglas | 430/113 |
| 5,518,948 | 5/1996 | Walker | 438/396 |
| 5,753,420 | 5/1998 | Misium | 430/313 |
| 5,882,535 | 3/1999 | Stocks et al. | 438/695 |

*Primary Examiner*—Olik Chaudhuri
*Assistant Examiner*—Anh Duy Mai
*Attorney, Agent, or Firm*—Thomas, Kayden, Horstemeyer & Risley

[57] ABSTRACT

A method of fabricating cylindrical capacitors comprising the steps of forming a gate and a source/drain region on a substrate, and then forming an insulating layer over the substrate. Next, a contact opening that exposes one of the source/drain regions is formed in the insulating layer. Subsequently, a first conductive layer is deposited over the insulating layer and into the contact opening, and then the first conductive layer is patterned. Thereafter, a first deep ultra-violet photoresist layer, a hard mask layer and a second deep ultra-violet photoresist layer are sequentially formed over the substrate structure. Next, the second deep ultra-violet photoresist layer is used as a mask to pattern the hard mask layer and the first deep ultra-violet photoresist layer. Ultimately, an opening that exposes a portion of the first conductive layer is formed. Then, the second deep ultra-violet photoresist layer is removed. After that, a silicon layer is formed on the sidewalls of the opening, and then the hard mask layer and the first deep ultra-violet photoresist layer are removed to expose the insulating layer and the silicon layer. The silicon layer and the first conductive layer together serve as the lower electrode of the capacitor. Finally, a dielectric layer and then a second conductive layer are sequentially formed over the lower electrode. The second conductive layer functions as the upper electrode of the capacitor.

18 Claims, 3 Drawing Sheets

METHOD OF FABRICATING A CYLINDRICAL CAPACITOR

CROSS-REFERENCE TO RELATED APPLICATION

This application claims the priority benefit of Taiwan application serial no. 87106242, filed Apr. 23, 1998, the full disclosure of which is incorporated herein by reference.

BACKGROUND OF THE INVENTION

1. Field of Invention

The present invention relates to a method of fabricating capacitors. More particularly, the present invention relates to a method of fabricating cylindrical capacitors.

2. Description of Related Art

Cylindrical capacitors are now widely used in dynamic random access memories that have memory capacity greater than 256M. FIGS. 1A through 1C are a series of diagrams showing the progression of manufacturing steps in fabricating a cylindrical capacitor over a device using a conventional method.

First, as shown in FIG. 1A, a shallow trench isolation (STI) structure 102, a gate oxide layer 104 and a gate 106 are formed above a substrate 100. Source/drain regions 108 are also formed in the substrate 100 one each side of the gate 106. Thereafter, an oxide layer 110, which serves as an insulating layer, is formed over the substrate 100. Then, a contact opening 112 is formed in the oxide layer 110 so that one of the source/drain regions 108 can be electrically connected by subsequent deposition of a conductive material.

Next, as shown in FIG. 1B, a second conductive layer 114 is formed over the oxide layer 110. Then, the conductive layer 114 is patterned to form a recessed opening 116 using photolithographic and etching operations. The recessed opening 116 is formed inside the conductive layer 114 above the contact opening 112. However, the recessed opening 116 does not penetrate the conductive layer 114 to expose the contact opening 112 or the oxide layer 110. Subsequently, the conductive layer 114 is patterned again forming a conductive layer 114a as shown in FIG. 1C. The cylindrical conductive layer 114a and the conductive material inside the contact opening 112 together form the lower electrode of the capacitor. Finally, a dielectric layer 116 and a third conductive layer 118 are sequentially formed over the conductive layer 114a, wherein the conductive layer 118 functions as the upper electrode of the capacitor.

In the conventional method of fabricating cylindrical capacitors, photolithographic and etching operations have to be carried out twice. Hence, processing is more complicated and consistent product quality is more difficult to achieve. In addition, dimensions of capacitor structures are difficult to control using conventional photoresist patterning techniques.

In light of the foregoing, there is a need to improve the method of fabricating cylindrical capacitors for memory devices.

SUMMARY OF THE INVENTION

Accordingly, the present invention is to provide a method that uses deep ultra-violet photoresist (DUV PR) instead of conventional photoresist and employs silylation techniques to form a silicon layer on the DUV PR, thereby simplifying the steps in fabricating cylindrical capacitors. Consequently, the dimensions of a capacitor can be more accurately controlled.

To achieve these and other advantages and in accordance with the purpose of the invention, as embodied and broadly described herein, the invention provides a method of fabricating cylindrical capacitors. The method comprises the steps of forming a gate and a source/drain region on a substrate, and then forming an insulating layer over the substrate. Next, a contact opening over the source/drain regions is formed in the insulating layer. Subsequently, a first conductive layer is deposited into the contact opening and over the insulating layer, and then the first conductive layer is patterned. Thereafter, a first deep ultra-violet photoresist layer, a hard mask layer and a second deep ultra-violet photoresist layer are sequentially formed over the substrate structure. Next, the second deep ultra-violet photoresist layer is used as a mask to pattern the hard mask layer and the first deep ultra-violet photoresist layer. Ultimately, an opening that exposes the first conductive layer is formed. Then, the second deep ultra-violet photoresist layer is removed. After that, a silicon layer is formed on the sidewalls of the opening, and then the hard mask layer and the first deep ultra-violet photoresist layer are removed to expose the insulating layer and the silicon layer. The silicon layer and the first conductive layer together serve as the lower electrode of the capacitor. Finally, a dielectric layer and then a second conductive layer are sequentially formed over the lower electrode. The second conductive layer functions as the upper electrode of the capacitor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
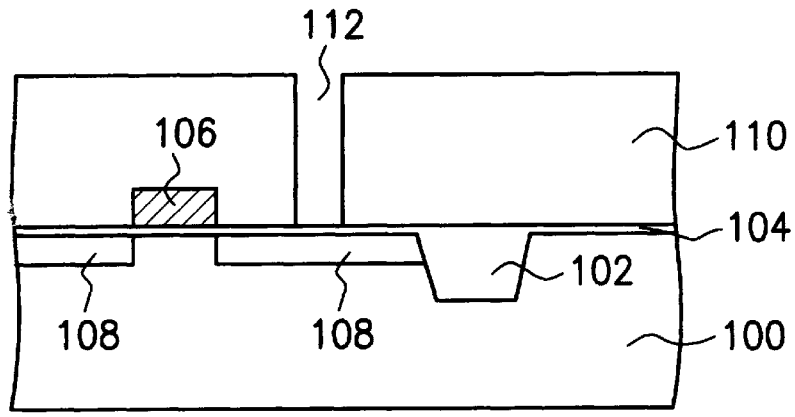
FIGS. 1A through 1C are cross-sectional views showing the progression of manufacturing steps in fabricating a cylindrical capacitor according to a conventional method.
Figure 1B:
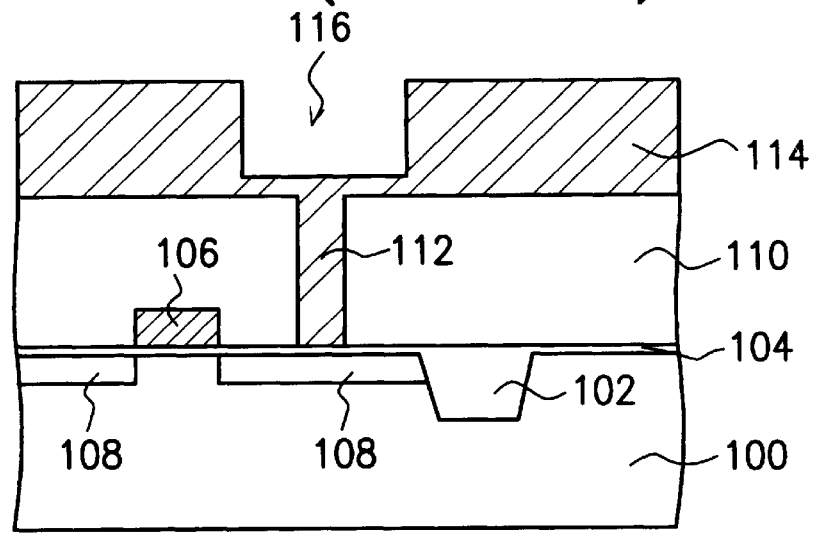
Figure 1C:
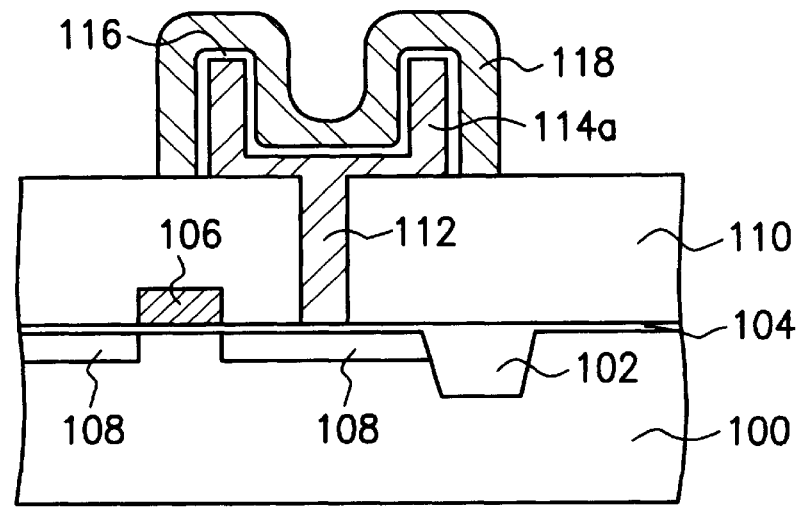

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are cross-sectional views showing the progression of manufacturing steps in fabricating a cylindrical capacitor according to one preferred embodiment of this invention.

Figure 2A:
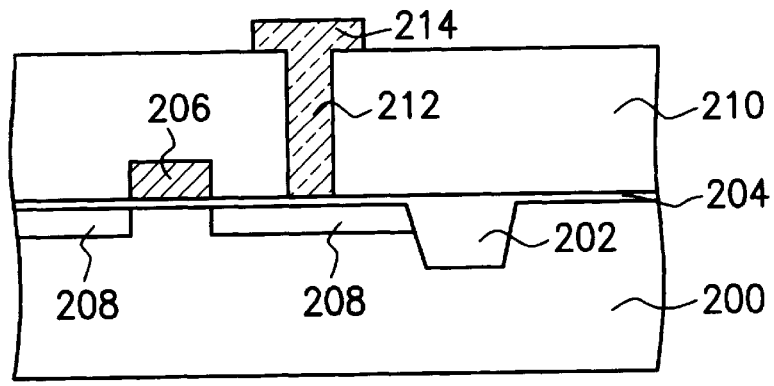
FIGS. 2A through 2F are cross-sectional views showing the progression of manufacturing steps in fabricating a cylindrical capacitor according to one preferred embodiment of this invention.

First, as shown in FIG. 2A, a device isolating structure, for example, a shallow trench isolating (STI) structure and a gate oxide layer 204, is formed on a substrate 200. Thereafter, a gate 206 is formed over the substrate 200. The gate 206 can be a polysilicon layer doped to increased its electrical conductivity. Then, source/drain regions 208 are formed in the substrate 200 on each side of the gate 206. Next, an insulating layer 210 is formed over the substrate 200, and then a contact opening 212 is formed in the insulating layer 210. The contact opening 212 exposes one of the source/drain regions 208. Subsequently, a conductive material is deposited into the opening 212 so that electrical connection can be made to the source/drain region 208. After that, another conductive layer 214 is formed over the insulating layer 210, and then the conductive layer 214 is patterned. The conductive layer 214 can be a doped polysilicon layer electrically connected to the conductive layer in the contact opening 212.

Figure 2B:
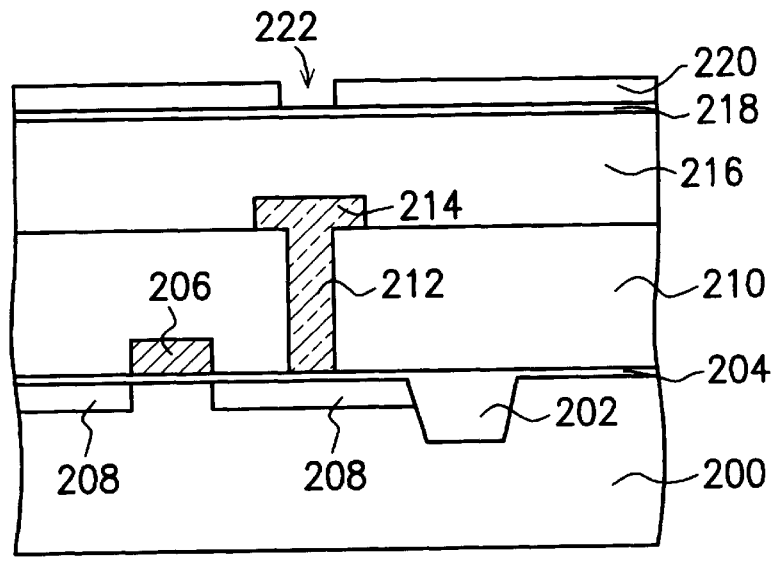

Next, as shown in FIG. 2B, a deep ultra-violet photoresist (DUV PR) layer 216 is formed over the insulating layer 210 and the conductive layer 214. Thereafter, a hard mask layer 218 is formed over the DUV PR layer 216. The hard mask layer 218 can be a silicon layer formed by using, for example, a silylation operation. The silylation operation can particularly convert material of the DUV photoresist layer 216 into silicon due to its reaction. The silylation reaction is well known by those skilled in the art, and need not be described herein. After the silylation operation, a rather thin silicon layer serving as the hard mask layer 218 is formed. Alternatively, after the silylation operation, gaseous oxygen or nitrogen is passed into a reaction chamber and then a plasma treatment is carried out to form a silicon oxide or silicon nitride layer. The silylation operation and the process of forming DUV PR layer 216 can be performed in-situ. Alternatively, an oxide layer such as a spin-on-glass (SOG) layer, is formed after the formation of the DUV PR layer 216. Next, another deep ultra-violet photoresist layer 220 is formed over the hard mask layer 218. Subsequently, a small opening 222 is formed in the DUV PR layer 220. The small opening 222 is formed above the conductive layer 214 by shining a deep ultra-violet light through a mask onto the deep ultra-violet photoresist layer 220 followed by photoresist development. Because the deep ultra-violet light source has a high resolution, the width of the opening 222 can be narrower than 0.25 $\mu$m.

Figure 2C:
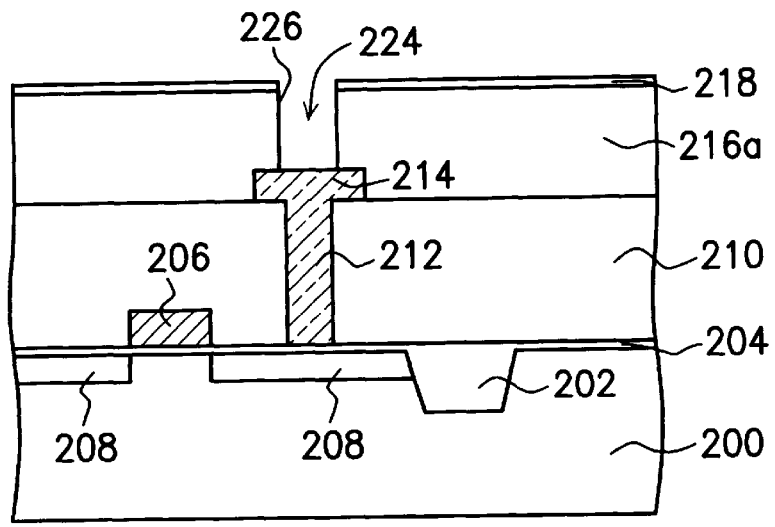

Thereafter, difference in etching rate between the hard mask layer 218 and the DUV PR layers 216 and 220 is utilized. The hard mask layer 218 and the deep ultra-violet photoresist layer 216 are etched, starting from the opening 222, to form an opening 224. The opening 224 exposes a portion of the conductive layer 214 and sidewalls 226 as shown in FIG. 2C. Subsequently, the DUV PR layer 220 is removed to expose the hard mask layer 218.

Figure 2D:
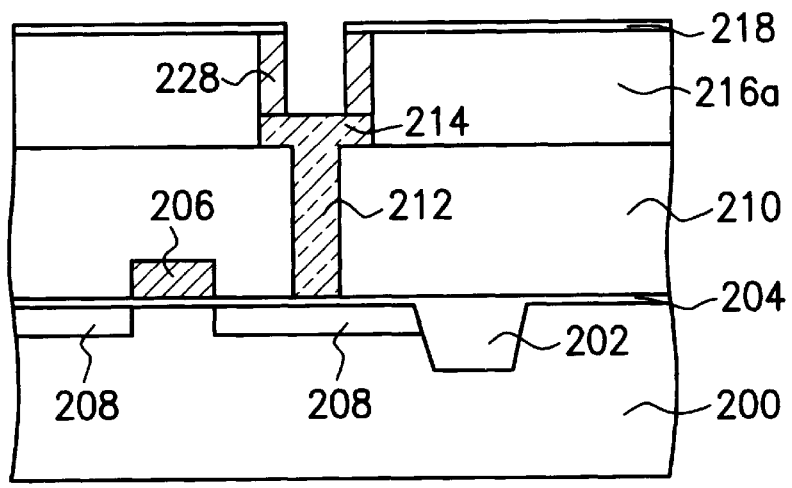
Figure 2E:
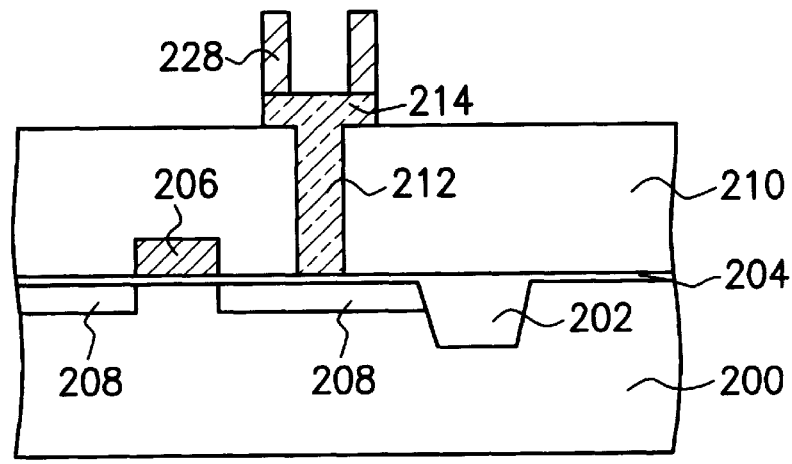

Next, as shown in FIG. 2D, silylation of the deep ultra-violet photoresist layer 216a can be carried out to form a very thin silicon layer 228 on the sidewalls of the opening 224. The purpose of the silylation reaction is similarly to convert a surface region of the sidewall of the opening 224 in the DUV photoresist layer 216a into silicon so that the thin silicon layer 228 is formed. After that, the hard mask layer 218 and the deep ultra-violet photoresist layer 216a are removed to expose the insulating layer 210 and the silicon layer 228 as shown in FIG. 2E. Next, an ion implantation is performed, implanting ions into the silicon layer 228, and then the silicon layer is annealed to increase its electrical conductivity. The cylindrical structure, which includes the silicon layer 228 and the conductive layer 214, constitutes the lower electrode of the capacitor.

Figure 2F:
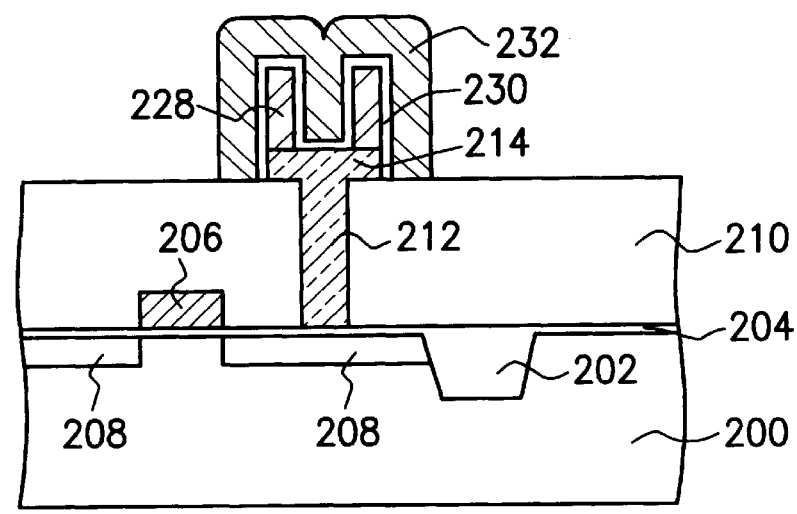

Finally, as shown in FIG. 2F, a dielectric layer 230 is formed over the lower electrode, and then another conductive layer 232 is formed over the dielectric layer 230. The conductive layer 232 functions as the upper electrode of the capacitor.

In summary, this invention utilizes the special properties of deep ultra-violet photoresist material together with a silylation operation to form a very thin silicon layer that acts as the supporting column of the cylindrical capacitor. In addition, a hard mask layer is used to avoid over-etching of the photoresist layer, and a thin, deep ultra-violet photoresist layer is used to control the dimensions of the capacitor precisely.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating cylindrical capacitors comprising the steps of:

providing a substrate;

forming a gate over the substrate and forming a source/drain region in the substrate;

forming an insulating layer over the substrate and the gate;

forming a contact opening in the insulating layer that exposes a portion of the source/drain region;

forming a first conductive layer over the insulating layer and then patterning the first conductive layer, wherein the patterned first conductive layer is able to connect electrically with one of the source/drain regions through the contact opening;

forming a first deep ultra-violet photoresist layer over the insulating layer and the conductive layer;

forming a hard mask layer over the first deep ultra-violet photoresist layer;

forming a second deep ultra-violet photoresist layer over the hard mask layer with an opening pattern above the contact opening;

patterning the hard mask layer and the first deep ultra-violet photoresist layer using the second deep ultra-violet photoresist layer as a mask and forming an opening in the first deep ultra-violet photoresist layer to expose a portion of the first conductive layer;

removing the second deep ultra-violet photoresist layer;

forming a silicon layer on a sidewall of the opening in the first deep ultra-violet photoresist layer by a silylation operation;

removing the hard mask layer and the first deep ultra-violet photoresist layer to expose the insulating layer and the silicon layer, wherein the silicon layer and the first conductive layer together form a lower electrode of the capacitor;

forming a dielectric layer over the lower electrode; and forming a second conductive layer over the dielectric layer, wherein the second conductive layer functions as an upper electrode of the capacitor.

2. The method of claim 1, wherein after the step of forming the silicon layer, further includes doping impurities into the silicon layer performing an annealing operation so as to improve conductivity.

3. The method of claim 1, wherein the step of forming the first conductive layer includes doping impurities into a polysilicon layer.

4. The method of claim 1, wherein the hard mask layer includes silicon.

5. The method of claim 4, wherein formation of the hard mask layer comprises performing a silylation process.

6. The method of claim 1, wherein the hard mask layer includes silicon nitride.

7. The method of claim 1, wherein the hard mask layer includes silicon oxide.

8. The method of claim 7, wherein the step of forming the hard mask layer includes a spin-on-glass method.

9. The method of claim 1, wherein in the step of forming the second deep ultra-violet photoresist layer, the opening pattern is formed by shinning, a deep ultra-violet light through a photomask onto the second deep ultra-violet photoresist layer and performing a photoresist development.

10. A method of fabricating a lower electrode of a capacitor, the method comprising the steps of:

provinding a substrate;

forming an insulating layer with a contact opening over the substrate;

forming a conductive layer over the insulating layer connecting to the substrate through the contact opening;

forming a deep ultra-violet photoresist layer over the insulating layer and the conductive layer;

forming a hard mask layer over the deep ultra-violet photoresist layer;

patterning the hard mask layer and the deep ultra-violet photoresist layer to form an opening exposing a portion of the conductive layer;

silylating the deep ultra-violet photoresist layer to form a silicon layer on the sidewall of the opening; and removing the hard mask layer and the deep ultra-violet photoresist layer.

11. The method of claim 10, wherein after formation of the silicon layer through silylating, the method further includes doping impurities into the silicon layer and performing an annealing operation.

12. The method of claim 10, wherein the hard mask layer includes a silicon layer.

13. The method of claim 12, wherein the step of formation of the silicon layer serving as the hard mask layer includes performing a silylation process on the deep ultra-violet photoresist layer.

14. The method of claim 13, wherein after formation of the silicon layer, the silicon layer is nitrified to form a silicon nitride layer by passing gaseous nitrogen in a plasma treatment process.

15. The method of claim 13, wherein after formation of the silicon layer, the silicon layer is oxidized to form a silicon oxide layer by passing gaseous oxygen in a plasma treatment process.

16. The method of claim 10, wherein the conductive layer and the silicon layer are electrically coupled together to serve as the lower electrode of the capacitor.

17. The method of claim 10, wherein the step of forming the hard mask layer includes forming an oxide layer using a spin-on-glass method.

18. A method of fabricating cylindrical capacitors the method comprising the steps of:

providing a substrate;

forming a gate over the substrate and forming a source/drain region in the substrate;

forming an insulating layer with a contact opening over the substrate and the gate;

forming a contact opening in the insulating layer that exposes a portion of the source/drain region;

forming a polysilicon layer over the insulating layer and then patterning the polysilicon layer, wherein the patterned polysilicon layer connects electrically with one of the source/drain regions through the contact opening;

forming a conductive layer over the insulating layer connecting to the substrate through the contact opening;

forming a first deep ultra-violet photoresist layer over the insulating layer and the conductive layer;

forming a hard mask layer over the first deep ultra-violet photoresist layer;

forming a second deep ultra-violet photoresist layer over the hard mask layer, wherein the second deep ultra-violet photoresist layer has a first opening;

patterning the hard mask layer and the first deep ultra-violet photoresist layer using the first opening to form a second an opening that exposes a portion of the polysiliconconductive layer;

removing the second deep ultra-violet photoresist layer;

forming a first silicon layer on the sidewalls of the second opening using a silylation process;

removing the hard mask layer and the first deep ultra-violet photoresist layer to expose the insulating layer and the first silicon layer, wherein the first silicon layer and the polysilicon layer together form a lower electrode of the capacitor;

forming a dielectric layer over the lower electrode; and forming a second conductive layer over the dielectric layer, wherein the second conductive layer functions as an upper electrode of the capacitor.

* * * * *